United States Patent [19]

Nijman et al.

[11] Patent Number: 4,484,151

[45] Date of Patent: Nov. 20, 1984

[54] AMPLIFIER CIRCUIT

[75] Inventors: Aloysius J. Nijman; Franciscus A. C. M. Schoofs; Job F. P. van Mil, all of Eindhoven, Netherlands

[73] Assignee: U.S. Philips Corporation, New York, N.Y.

[21] Appl. No.: 524,694

[22] Filed: Aug. 19, 1983

Related U.S. Application Data

[63] Continuation of Ser. No. 239,876, Mar. 2, 1981.

[30] Foreign Application Priority Data

Mar. 10, 1980 [NL] Netherlands ............... 8001410

[51] Int. Cl.³ .............................................. H03F 3/30
[52] U.S. Cl. .................................... 330/297; 330/268
[58] Field of Search ............... 330/267, 268, 296, 297

[56] References Cited

U.S. PATENT DOCUMENTS

3,622,899 11/1971 Eisenberg ............... 330/297 X
4,100,501 7/1978 Nakagaki et al. ............... 330/263

Primary Examiner—James B. Mullins
Attorney, Agent, or Firm—Thomas A. Briody; William J. Streeter

[57] ABSTRACT

An amplifier circuit for supplying output voltages which are much higher than the breakdown voltage of the individual components forming the amplifier comprises a control circuit (1) and an amplifier stage (2). The amplifier stage (2) comprises 2n transistors (7–12) where n is an integer greater than one, having their main current paths serially connected between two supply terminals (3, 4). The bases of the transistors (7–12) are connected to tapping points on a series chain of diodes (34–41) in the control circuit (1). Further supply sources (13–16) apply an incrementally decreasing sequence of voltages to transistors (8, 9) and (10, 11) so that the voltage across any of the transistors (7–12) is limited to one increment of the sequence of voltages.

6 Claims, 4 Drawing Figures

AMPLIFIER CIRCUIT

This is a continuation, of application Ser. No. 239,876, filed Mar. 2, 1981.

BACKGROUND OF THE INVENTION

The invention relates to an amplifier circuit comprising a control circuit, an amplifier stage connected thereto, two supply terminals coupled to supply sources for applying mutually different potentials to the supply terminals, the amplifier stage comprising 2n transistors, where n is an integer greater than one. Each of the transistors have a main current path and a control electrode, the main current paths being connected in series between the two supply terminals. The amplifier stage further comprises an output terminal connected to the junction of the nth and the (n+1)th main current paths of the series arrangement of transistors, the n transistors located between a first terminal of the two supply terminals and the output terminal being of a complementary conduction type to the n transistors located between the output terminal and the second terminal of the two supply terminals. 2(n−1) further supply terminals are also provided, each of which is connected via at least one diode to one junction point of consecutive main current paths of the series arrangement of the transistors, the junction points to which the further supply terminals are connected, not being connected to the output terminal. The further supply terminals are also connected to further supply sources for applying to the supply terminals supply voltages located between the potentials of the two supply sources, the diodes being connected such that the diode connected to a predetermined junction point is reverse-biassed when the potential of that junction point lies between the potential of the further supply terminal coupled to that diode and the potential of the supply terminal on the same side of the load connection as the further supply terminal.

Such an amplifier circuit, in which a sequence of supply potentials, which decrease incrementally from the first to the second supply terminal, are applied to the respective 2(n−1) further supply terminals, is disclosed in U.S. Pat. No. 3,622,899. Such an amplifier circuit may be used inter alia as an audio amplifier or as a driver stage in the line circuit of telephony systems.

In these amplifier circuits, the magnitudes of the instantaneous output voltage and the direction of the output current, determine which of the transistors of the series arrangement are conducting and which are non-conducting. As the value of the supply voltage is determined by the number of transistors which are conducting, this has the advantage that, in these amplifiers, a wide voltage range of the output signal is accompanied by a low internal dissipation.

However, such an amplifier circuit is not suitable for operation with output voltages which are more than twice the collector-emitter breakdown voltage of the transistors used. This prevents, in particular, the use of such amplifier circuits in integrated form in driver stages in subscriber's circuits or audio and video amplifier applications where high operating voltages are used.

Furthermore, the reduction of dissipation is small only when the sign of the output current is opposite to the sign of the output voltage, as may be the case during a portion of each period of the output signal as the result of a reactive load or when there are large common mode signals on subscriber's lines in telephony systems.

SUMMARY OF THE INVENTION

It is an object of the invention to provide an amplifier circuit as described in the opening paragraph having a larger permissible output voltage.

The invention provides a circuit as described in the opening paragraph characterized in that the further voltage sources apply at least substantially similar sequences of incrementally decreasing supply voltages to both the respective (n−1) further supply terminals, considered from that terminal of the two supply terminal, which has the highest polarity towards the output terminals, and to the respective (n−1) further terminals considered from the output terminal towards the other one of the two supply terminals.

This amplifier circuit has the advantage that at least the amplifier stage of this amplifier circuit can be implememted in integrated form while still producing a relatively high output voltage, so that such an integrated amplifier may inter alia be used as a driver stage in a subscriber's circuit of a telephony system.

A further advantage is that a relatively larger reduction in dissipation can be obtained for an output current which differs in sign from the output voltage than in the aforementioned known amplifier circuit.

In accordance with a further feature, the amplifier circuit is constructed such that the 2n transistors are constructed so that the leakage currents of the transistors in each group n of consecutive transistors, located at both sides of the output terminal, increase from the supply terminals towards the output terminal.

This has the advantage that the voltage across each transistor in the non-conductive state may be restricted to a value which is substantially equal to one step of the incremently decreasing sequence of supply voltages.

In an amplifier circuit in which the control circuit includes a series circuit connected between first and second control circuit supply terminals, the amplifier circuit may be constructed such that the series circuit comprises n serially arranged impedance circuits, optionally a voltage shifting stage, and n driver transistors having their main current conduction paths arranged serially, that the junctions of the impedance circuits, voltage shifting stage, and driver transistors are connected sequentially to the base terminals of the amplifier stage, the junctions of the impedance circuits being connected to the base terminals of the transistors connected between the first supply terminal of the amplifier stage and the output terminal, that the further supply terminals are connected sequentially to the junctions between the impedance circuits via diodes, that an input terminal is connected to the base of the driver transistor connected to the second control circuit supply terminal, and that the further supply terminals are connected sequentially to the bases of the other driver transistors.

This has the advantage that the whole amplifier circuit can be implemented with the same technology.

DESCRIPTION OF THE DRAWINGS

Embodiments of the invention and their advantages will now be described, by way of example, with reference to the accompanying drawings, in which.

In the Figures showing the various embodiments, corresponding elements have been given the same reference numerals.

DESCRIPTION OF THE PREFERRED EMBODIMENTS

Figure 1:
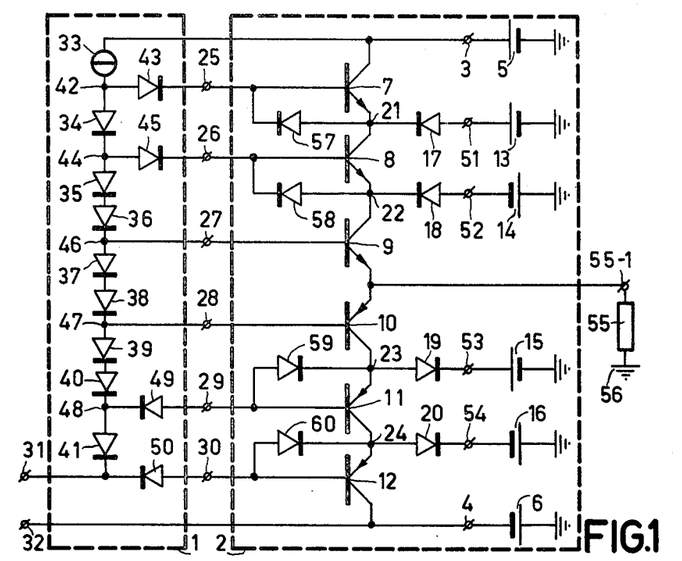
FIG. 1 shows a first embodiment of an amplifier circuit according to the invention.

The amplifier circuit shown in FIG. 1 comprises a control circuit 1 and an amplifier stage 2. The amplifier stage includes two supply terminals 3, 4 to which supply sources 5 and 6, respectively apply mutually different potentials.

A series arrangement consisting of 2n transistors, where in this embodiment n is equal to three, is arranged between these supply terminals 3 and 4, the six transistors being referenced 7 to 12 inclusive. An output terminal 55-1 is connected to the junction point of the main current path of the $n^{th}$ transistor and the (n+1)th transistor, which, in this embodiment, is the junction point of the main current path of transistor 9 and the main current path of transistor 10. A load 55 is connected between the terminal 55-1 and a point 56 at ground potential.

The transistors 7, 8, and 9 are of complementary type compared with the transistors 10, 11 and 12. Further voltage sources 13 to 16 inclusive, one side of each of which is connected to ground and whose other sides are respective to junction points 21 to 24 of the main current paths of the transistors 7 to 12 inclusive, via further terminals 51 to 54 inclusive and diodes 17 to 20 inclusive, are provided to supply power to the transistors 8, 9, 10 and 11. More particularly, voltage source 13 is connected to the junction point 21 of the main current paths of the transistors 7 and 8 via the further terminal 51 and the diode 17. Similarly voltage source 14 is connected to the junction point 22 of the main current paths of the transistors 8 and 9 via the further terminal 52 and the diode 18, voltage source 15 is connected to the junction point 23 of the main current paths of the transistors 10 and 11 via the further terminal 53 and the diode 19, and voltage source 16 is connected to the junction point 24 of the main current paths of the transistors 11 and 12 via the further terminal 54 and the diode 20. The current conduction direction of the diode 17 is the same as that of the base-emitter junction of transistor 7, the current conduction direction of diode 18 is the same as that of the base-emitter junction of transistor 8, the current conduction direction of diode 19 is the same as that of the base-emitter junction of transistor 11, and the current conduction direction of diode 20 is the same as that of the base-emitter junction of transistor 12.

The base terminals 25 to 30 of transistors 7 to 12 inclusive are connected to the control circuit 1.

The control circuit 1 has a pair of input terminals 31 and 32, to which an input signal is applied, and, as shown in FIG. 1, the input terminal 32 is connected to the second supply terminal 4. The control circuit 1 further comprises a series arrangement of a current source 33 in the form of a resistor, and a number of voltage shifting stages in the form of diodes 34 to 41 inclusive. The diodes 34 to 41 are forward-biassed as viewed from the current source and the series arrangement is connected between the first supply terminal 3 and the input terminal 31. The base terminals 25 to 30, inclusive, are connected to taps of this series arrangement. More specifically tapping point 42 between the current source 33 and the diode 34 is connected to terminal 25 via a diode 43, tapping point 44 between the diodes 34 and 35 is connected to terminal 26 via a diode 45, tapping point 46 between the diodes 36 and 37 is connected directly to terminal 27, tapping point 47 between the diode 38 and diode 39 is connected directly to terminal 28, and tapping point 48 between the diode 40 and diode 41 is connected to terminal 29 via a diode 49. Furthermore, input terminal 31 is connected to terminal 30 via a diode 50.

The current conduction directions of each of the diodes 43, 45, 49 and 50 corresponds to that of the base-emitter junction of the transistor to which it is connected.

The operation of the amplifier circuit will now be further explained; it should be noted that in this embodiment the voltage of the supply source 6 has been chosen so that the potential at terminal 4 is equal to $-100$ volts.

It should also be noted that the supply voltage for the control circuit may alternatively be derived from supply sources other than the sources 5 and 6.

Further supply sources 13 and 14 apply an incrementally decreasing sequence of voltages to further supply terminals 51 and 52 while further supply sources 15 and 16 apply the same, or substantially the same, incrementally decreasing sequence of voltages to further supply terminals 53 and 54, these voltages being in this embodiment 0 volt for the sources 13 and 15, and $-50$ volts for the sources 14 and 16. When an input signal is applied to the input terminals 31 and 32 with a voltage less than the voltage difference between the voltage sources 6 and 16, which is in this case less than $+50$ volts with respect to terminal 4, then the current supplied by the current source 33 will flow to input terminal 31 and, in the case of a resistive load, current will be obtained via the load 55, which current flows to input terminal 31 via the base-emitter junction of transistor 10, the base terminal 28 and the diodes 39, 40 and 41, causing transistor 10 to become conductive and the load current to flow to the terminal 31 via the base-emitter junction of transistor 11, the diode 49 and the diode 41, causing transistor 11 to become conductive. The load current then not only flows to the supply source 16 via the diode 20, but also to the input terminal via the base-emitter junction of transistor 12 and diode 50, causing transistor 12 to become conductive. The diode 20 is then rendered nonconducting and the load current flows to the supply source 6 via the main current paths of the transistors 10, 11 and 12. This means that the input signal whose power has been amplified is applied to the load 55.

It should be noted that the voltage across the transistor 9 is limited by the application of substantially the same incrementally decreasing sequence of voltages to the further supply terminals 51 and 52 as is applied to the further supply terminals 53 and 54. Consequently, the maximum value of the voltage across transistor 9 is equal to one step of the aforementioned sequence of incrementally decreasing voltages. Namely, the voltage at the output terminal 55-1 is equal, but for 4 junction voltages, to the voltage at input terminal 31, which is between $-100$ volts and $-50$ volts, while the voltage at the junction point 22 is $-50$ volts, so that a voltage of not more than 50 volts can be produced across the transistor 9. This produces the considerable advantage that this amplifier stage, which produces output voltages in a range of 150 volts, can be realized in so-called low-voltage technology and can, therefore, be more easily implemented in integrated form. In the case where a current is externally impressed on the said input voltage which current withdraws current from output terminal 55-1, transistor 9 is rendered conductive because a small portion of the current produced by the current source 33 flows to the output terminal 55-1 via the diodes 34, 35, 36 and the base-emitter junction of transistor 9. The load current is then produced by the voltage source 14 and flows through the diode 18 and the main current path of transistor 9. This has the advantage that the load current is produced by a voltage source which has a voltage which exceeds the voltage of supply source 6 by one incremental step of the sequence of decreasing supply voltages. This results in a decrease of the dissipation in the above-described amplifier stage at the input voltage during the withdrawal of load current compared with the amplifier disclosed in the U.S. Pat. No. 3,622,899. The externally impressed currents may be caused by common mode (in-phase signals) interference when the amplifier circuit is used as an amplifier in a subscriber's circuit in telecommunication, which interference may produce currents which exceed the output current to be produced in response to the input signal, or may be produced when the load 55 is reactive at the moment the current and the voltage are of different signs during a portion of a period in response to a phase shift then occurring.

An increase of the input voltage to a value greater than or equal to +50 V, but less than +100 V with respect to the voltage at terminal 32 causes the diode 20 to be rendered conductive and the current flowing through the transistor 11 to flow to the −50 V voltage source 16 via diode 20. Transistor 12 is then rendered non-conducting. This has the considerable advantage that, for lower output voltages, the voltage source from which supply voltage is obtained has also a lower voltage, in this embodiment −50 V instead of −100 V. For input signals located in the aforementioned voltage range from +50 V to +100 V with respect to the voltage at terminal 32, this results in a decrease in dissipation equal to the current applied to the load 55 multiplied by the 50 V voltage step. Withdrawing current at output terminal 55-1 has the same advantage as regards dissipation as described hereinbefore with reference to the said United States Patent.

A further increase of the input voltage to above or equal to +100 V and less than +150 V with respect to the voltage at terminal 32 results in the voltage at the junction points 42 to 48 inclusive having a potential of such a high value that the transistors 10 and 11 are rendered non-conductive in the case of a resistive load and that further a small portion of the current produced by the current source 33 flows to the load via the diodes 34, 35 and 36, base terminal 27, and the base-emitter junction of transistor 9, causing transistor 9 to become conductive and the load current to be supplied by the supply source 14 via the main current path of transistor 9 and the diode 18. As a result thereof a small portion of the current supplied by the current source 33 flows to the load 55 via the diodes 34 and 45, the base terminal 26, the base-emitter junction of transistor 8 and the collector-emitter path of transistor 9, causing transistor 8 to be rendered conductive and the load current to be supplied by the voltage source 13 via the main current paths of the transistors 8 and 9 and via the diode 43, the base terminal 25, and the base-emitter junction of transistor 7. The diode 18 is then rendered non-conducting.

The transistor 7 then becomes conductive and the load current is applied to the load 55 from the +50 volts supply source 5 via the main current paths of the transistors 7, 8 and 9.

The measure of choosing an incrementally decreasing sequence of supply voltages for the supply sources 15 and 16 equal to, or almost equal to, the incrementally decreasing sequence of supply voltages of the supply sources 13 and 14, limits the voltage across the transistor 10 to one incremental step of the said decreasing sequence of supply voltages. Namely, the voltage across the load 55 is almost equal to the voltage of input terminal 31 which is +100 to +150 volts above the −100 volts voltage of terminal 32, that is to say 0 to +50 volts above the voltage at the point 56 of common potential.

The voltage of the junction point 23 is equal to the voltage of supply source 15 and is therefore 0 volt, so that the voltage between the collector and emitter terminals of transistor 10 is not more than 50 volts. This permits implementation of this high output voltage power amplifier stage in so-called low voltage techniques.

When, at the aforementioned input voltage i.e. +100 to +150 V, a current is applied to the output terminal 55-1 by the load 55 instead of a current being withdrawn there, which situation may occur with common mode signals on subscriber's lines in telephone systems and during portions of the period of the output signal with a reactive load, a current flows from output terminal 55-1 to the input terminal via the emitter-base junction of transistor 10 and the diodes 39, 40 and 41, causing transistor 10 to become conductive. Then the current supplied by the load flows to the supply source 15 via the main current path of the transistor 10 and the diode 19. In a corresponding manner as described for input signals located between 0 and 50 volts this result in a decrease of the dissipation with respect to the dissipation in the amplifier circuit disclosed in the United States Patent mentioned in the preamble.

From the above it follows that an amplifier circuit suitable for audio applications can be obtained by, for example, extending the drive range from +50 volts to +100 volts. This can be done in a simple manner by the addition of a +100 volts voltage source and an additional transistor in each half of the series arrangement of transistors 7 to 12, inclusive, together with the associated additional connections to the +100 volts supply source in the upper half of the series arrangement and the additional connections to the +100 volts supply source in the upper half of the series arrangement and the additional connection to the +50 volts voltage source 5 in the lower half of the series arrangement. Then, the supply source 5 must be connected to both the transistor 7 via a diode and, via a further diode, to the additional transistor in the lower half of the series arrangement. The control circuit must then be provided with additional taps by including additional voltage shifting stages, such as diodes, the number of diodes viewed from a junction point towards the emitter of the transistor whose base is coupled to the junction point being equal to the number of diodes viewed towards the next junction point in the said series arrangement. Also in this symmetrical construction of the amplifier stage, so also for the amplifier circuit which, in this example, has been rated for output voltages from +100 volts to −100 volts the voltage across the collector-emitter junction in the cutoff direction of the transistor is not more than one incremental step, being 50 volts. By using a plurality of series connected transistors, any desired output voltage can thus be generated, while the voltage across each transistor is limited to one incremental step.

It should be noted that a different value may be chosen for the incremental step of the decreasing sequence of voltages for a given output voltage. However, a reduction of the step size requires more transistors in the transistor series arrangement, an associated extension of the control circuit and a larger number of supply sources. Consequently, the general aim will be to choose the number of transistors in the series arrangement such that the maximum permissible inverse voltage, associated with the technology in which the amplifier stage is implemented, is across each of the transistors in this series circuit.

Distribution of the total voltage drop across the transistors which are not conductive at a predetermined input voltage may be guaranteed in a simple manner by arranging the transistors in each half of the series arrangement so that the leakage current of each of these transistors increases as the transistor is closer to the output terminal 55-1. This can be realized in an amplifier circuit implemented as an integrated circuit by choosing in the consecutive transistors increasingly larger base-collector junction surface areas.

This means that the leakage current of transistor 7 is smaller than that of transistor 8 and that the leakage current of transistor 8 is smaller than that of transistor 9. Likewise, the leakage current of transistor 12 is smaller than that of transistor 11 and the leakage current of transistor 11 is smaller than that of transistor 10. When the transistors 7, 8 and 9 are non-conducting, the leakage current of transistor 7 will be discharged via transistor 8. However, as this transistor 8 has a leakage current which is larger than that of transistor 7 the difference in these leakage currents is applied to transistor 8 by the supply source 13 via diode 17. This has the advantage that the voltage at the junction point 21 is defined and is substantially equal to the voltage of the supply source 13, i.e. 0 volt. Consequently, an incremental step of the decreasing voltage sequence, i.e. 50 volts, is applied across transistor 7. Since the leakage current of transistor 9 is larger than that of transistor 8, the difference between these leakage currents is applied to transistor 9 by the supply source 14 via diode 18. This causes the voltage drop across transistor 8 to be also limited to 50 volts, which applies in a similar manner to the voltage drop across the transistors 11 and 12. The limited voltage drop across transistors 9 and 10 has already been extensively explained in the foregoing. The total voltage drop, which has been divided into equal portions in this simple manner renders the implementation of the high output voltage amplifier stage in low-voltage technology possible.

It is alternatively possible to use pairs of transistors arranged in Darlington configuration instead of the single transistors 7 through 12. Then, however, the voltage shift between each consecutive tapping point of the series arrangement in the control circuit 1 must be increased, for example the number of diodes arranged between the tapping points must be increased by one.

To prevent inverse voltages of too high a value being produced across the base-emitter junctions of the transistors 7 and 8 at a very low input voltage, the control circuit comprises the diodes 43 and 45. Likewise, the diodes 49 and 50 are intended to protect the base-emitter junctions of the transistors 11 and 12. However, leakage currents of the diodes 43, 45, 49 and 50 may be larger than those of the base-emitter junctions of the associated transistors 7, 8, 11 and 12, so that the voltages are still applied, for a major part, across said base-emitter junctions. To prevent this, these junctions are shunted by the diodes 57, 58, 59 and 60, respectively. The current conduction direction of these diodes is the opposite of that of the associated base-emitter junctions, so that said inverse voltages are applied substantially wholly across the diodes 43, 45, 49 and 50.

When higher output voltages are desired, these diodes can be protected from excessively high voltage in the reverse direction by using a plurality of series-arranged diodes instead of one single diode. The voltage shifter between the tapping points must then be adapted, for example, by increasing the numbers of diodes arranged between consecutive taps in the series circuit of the control circuit. So far it has been assumed, for the power amplifier circuit described, that the control circuit 1 has been implemented in such a technology that particularly the current source 33 can withstand 150 volts produced at an input voltage of 0 volt and that the high input voltages are available between the input terminals 31 and 32. To obviate these drawbacks and particularly to enable implementation of the control circuit 1 in the same low-voltage technology as the amplifier 2, the amplifier circuit shown in FIG. 2 may be used.

Figure 2:
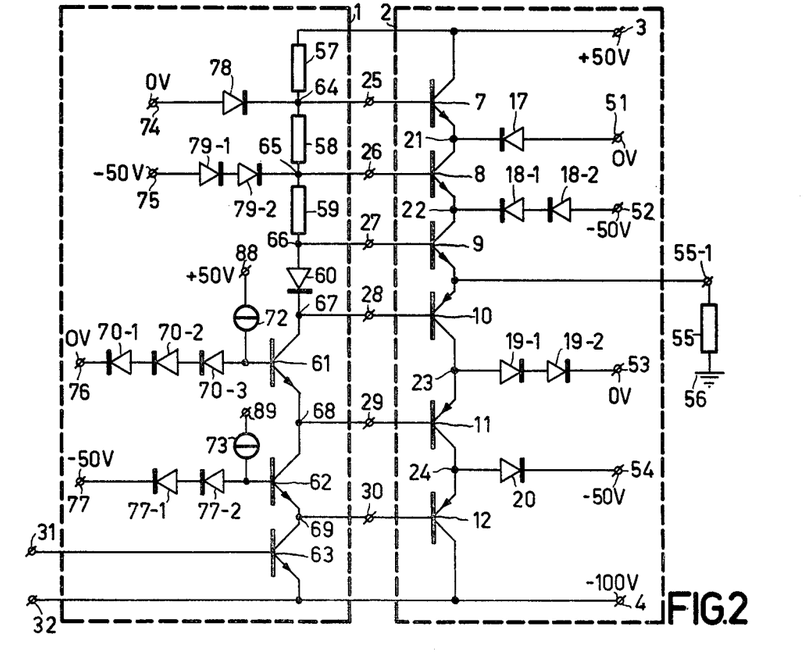
FIG. 2 shows a second embodiment of an amplifier circuit according to the invention.

The control circuit 1 shown in this FIG. 2 is formed by a series circuit arranged between the supply terminals 3 and 4. Generally, this series circuit comprises n impedance circuits, optionally a voltage shifting stage arranged in series therewith and formed by at least one diode and the main current paths of n driver transistors arranged in series with this diode. As in the embodiment shown in FIG. 1 the amplifier stage 2 has six transistors and the series circuit comprises three impedance circuits 57, 58, and 59, a voltage shifting stage implemented with one, or possibly, two diodes 60, and three driver transistors 61, 62 and 63. In this series circuit, tapping points 64, 65, 66, 67, 68 and 69 are located between each of these elements, these tapping points being connected sequentially one tapping point to one of the respective base terminals 25 through 30 of the amplifier stage 2. Resistors may be used for the impedance circuits 57 to 59 inclusive, but it is recommended to construct them as current sources, particularly in the form as will be further explained with reference to FIG. 4.

Further, the control circuit 1 has supply terminals 74, 75 and supply terminals 76, 77. Substantially the same incrementally decreasing sequence of voltages is applied to the supply terminals 74 and 75 as is applied to the further supply terminals 51 and 52 of the amplifier stage 2 and substantially the same incrementally decreasing sequence of supply voltages is applied to the supply terminals 76 and 77 as is applied to the further supply terminals 53 and 54 of the amplifier. In this embodiment, the supply terminals 51, 53, 74 and 76 may be interconnected. Likewise, the supply terminals 52, 54, 75 and 77 may also be interconnected. The transistors 61 to 63 inclusive are of the same conductivity type as the transistors 7 to 9 inclusive, the collectors of the driver transistors 61 to 63 inclusive being connected to the tapping points 67 to 69 inclusive.

Further, the supply terminal 74 is connected to tapping point 64 by means of a diode 78, the supply terminal 75 is connected to tapping point 65 by means of two diodes 79-1 and 79-2, the supply terminal 76 is connected to the base of the driver transistor 61 by means of three diodes 70-1, 70-2 and 70-3, the supply terminal 77 is connected to the base of driver transistor 62 by means of two diodes 77-1 and 77-1 and the input terminal 31 is connected to the base of driver transistor 63. In order to apply base current to the driver transistors 61 and 62, a further current source 72 is arranged between a supply terminal 88 and the base of driver transistor 61 and a further current source 73 is connected between a supply terminal 89 and the base of driver transistor 62. Voltages which are one incremental step higher than the voltages at the supply terminals 76 and 77, namely +50 volts and 0 volt, are applied to the supply terminals 88 and 89.

Furthermore, in the amplifier stage 2, the diode 18 has been replaced by two diodes 18-1 and 18-2 and the diode 19 has been replaced by two diodes 19-1 and 19-2.

This amplifier circuit operates as follows:

At an input voltage which exceeds 0.7 Volt to such an extent that in response thereto a base current of such a value is applied to the driver transistor 63 that it is driven to saturation, the voltage at tapping point 69 is slightly more positive than −100 volts. This causes the current supplied by the current source 73 to flow to supply terminal 4 via the base-emitter junction of driver transistor 62 and the main current path of driver transistor 63. The driver transistor 62 is then in the saturated state, so that the voltage at tapping point 68 is also slightly more positive than −100 volts. The current supplied by the current source 72 flows to the supply terminal 4 via the base-emitter junction of driver transistor 61 and the main current paths of the driver transistors 62 and 63 the driver transistor 61 then being the saturated state and the voltage at tapping point 66 also being slightly positive with respect to the −100 volts. The major part of the current flowing through the main current path of transistor 61 is supplied from supply terminal 3 via the diode 60 and the series arrangement of the impedance circuits 57, 58 and 59, which are in the form of current sources.

The impedance circuits 57 to 59 inclusive, which are in the form of current sources, are rated such that the current produced by the current source 59 slightly exceeds the current produced by current source 58 and that this current slightly exceeds the current produced by the current source 57. In a practical construction, the values of these currents are 1.2, 1.1 and 1.0 mA, respectively. The difference in current intensity of current source 59 and current source 58 is applied to the current source 59 from supply terminal 75 via the diodes 79-1 and 79-2. Likewise, the difference in current intensity of current source 58 and current source 57 is applied to the current source 58 from supply terminal 74 via diode 78.

This causes the voltages at the tapping points 64 and 65 to be fixed at 0 volt less one junction voltage and at −50 volts less two junction voltages, respectively. Then the voltage applied across each of the current sources 57 to 59 inclusive is not substantially more than the voltage of one step of the incrementally decreasing sequence of voltages, or 50 volts. This has the advantage that these current sources can be implemented in the same low-voltage technology as the elements of amplifier stage 2.

A small portion of the current flowing through the driver transistor 61 is withdrawn from the load 55. At said input signal, there flows a current from output terminal 55-1, the base-emitter junction of transistor 10 and the main current paths of the driver transistors 61 to 63, inclusive to the supply terminal 4. This current renders transistor 10 conductive, causing a load current to flow to the supply terminal 4 via the base-emitter junction of transistor 11 and the main current paths of the driver transistors 62 and 63. This current renders transistor 11 conductive, causing the load current to flow to the further supply terminal 54 via the main current paths of the transistors 10 and 11 and the diode 20. A small portion of the current flowing through the main current path of transistor 11 flows to the supply terminal via the base-emitter junction of transistor 12 and the main current path of the driver transistor 63. This renders transistor 12 conductive, causing diode 20 to be cut-off and the load current to flow to the supply terminal 4 via the main current paths of the transistors 10, 11 and 12.

It should be noted that the voltage across the diodes 19-1 and 19-2 is then −100 volts. For this reason two diodes have been provided, so that the voltage drop across each diode is not more than 50 volts at a maximum.

Also in this embodiment, when the current direction is reversed, the current will be derived from transistor 9 in a similar manner as shown in the embodiment of FIG. 1 and with the same advantages.

When the input signal decreases, the current through the driver transistor 63 will decrease. In response thereto the voltage at tapping point 69 increases. As long as the voltage does not increase to above −50 volts increased by one junction voltage, the current produced by the current source 73 will be discharged in its totality via the driver transistor 63, and the driver transistors 61 and 62 remain in the saturated state.

As a result thereof the voltage at tapping point 66 increases, neglecting the voltage drop across the saturated transistors 61 and 62 and the diode 60, but will also not increase to above the aforementioned voltage and the diodes 79-1 and 79-2 remain conductive.

The voltage increase across the driver transistor 63 in response to a small decrease of the collector current through this driver transistor 63 at a small decrease of the input signal, causes a voltage decrease across the current source 59, this voltage decrease being of the same amplitude as the voltage increase across the transistor 63. Apart from the base currents of the transistors 10, 11 and 12, the current source 59 forms the load of the driver transistor 63, as a result of which an amplified output signal is obtained. The decrease of the current through driver transistor 63 results in a decrease of the control currents of the transistors 10, 11 and 12, so that the current through the load decreases. As a consequence thereof the voltage across the load decreases. When the voltage across driver transistor 63 has increased to such an extent that the voltage drop across current source 59 is approximately one and a half volt; current source 59 cannot discharge all its current. This means that, at the voltage drop present across the current source 59, this source is driven to saturation and it supplies less current until the current is equal to the current of current source 58. At that instant the diodes 79-1 and 79-2 are reverse-biassed and current source 58 supplies the current through the main current paths of transistors 61, 62 and 63.

At a further decrease of the input signal the voltage at tapping point 69 will increase to −50 volts increased by one junction voltage. When the voltage at this point wants to increase still further, then the current of current source 73 starts flowing through the supply terminal 77 via the diodes 71-1 and 71-2. The voltage at the base of transistor 62 is then clamped at −50 volts plus the voltage drop across diodes 70-1 and 70-2 and consequently the voltage at the emitter is limited to −50 volts increased by one junction voltage. This has the advantage that the voltage drop across the control transistor 63 never substantially exceeds −50 volts and consequently this transistor can be implemented in a low-voltage technology which is the same as the technology by means of which the amplifier stage 2 is implemented.

In addition, the high voltage of tapping point 69 results in the voltage at the base of transistor 12 increasing to such a value that no current can flow any longer from the main current path of transistor 11 to the base of the transistor 12, as it will flow to the further supply terminal 54 via the diode 20. The transistor 12 is then rendered non-conductive. To ensure that in this case the transistor is always rendered non-conductive, the base circuit of the driver transistor 62 has one diode more than the diode arrangement connected in series with the supply terminal 54.

The advantage of supplying power from a source having a lower voltage has already been extensively explained with reference to the embodiment shown in FIG. 1.

The decrease of the base current of driver transistor 62 results in this driver transistor being driven out of saturation and consequently the voltage of its collector increases. At a further decrease of the input signal the voltage across driver transistor 62 will increase still further as increasingly more current flows from current source 73 to the supply terminal 77 via the diodes 71-1 and 71-2. As long as the voltage at the tapping point 65 does not increase to above 0 volt decreased by one junction voltage and a residual voltage across current source 58, an increase in the voltage across driver transistor 62 will result in a voltage decrease across current source 58. The voltage at tapping point 64 remains fixed at 50 volts. Consequently, the current source 58 is used as a load resistor for the driver transistor 62 in the output voltage range from approximately −50 volts to approximately 0 volt.

Everything said in the foregoing about driver transistor 63 and current source 59 for the output voltage range from −100 volts to −50 volts applies in a corresponding manner to the driver transistor 62 and the current source 58 for the output voltage range from −50 volts to 0 volt.

When the input signal decreases so far that the voltage at tapping point 68 is equal to 0 volt increased by two junction voltages, then the voltage at this point will not be able to increase any further as the base current produced by the current source 72 then starts flowing to the supply terminal 76 via the diodes 70-1, 70-2 and 70-3, causing driver transistor 61 to be driven out of saturation which, in a similar manner as described for driver transistor 62, results in the voltage at tapping point 68 being fixed at 0 volt, increased by two junction voltages. This has the advantage that the voltage drop across driver transistor 62 is limited to approximately 50 volts.

The high voltage at tapping point 68 will cause transistor 11 to be rendered non-conductive. To ensure that in this case transistor 11 will always be rendered non-conductive, the number of diodes in the control circuit of driver transistor 61 exceeds the number of diodes arranged between the emitter of transistor 11 and the further supply terminal 53 by one. For reasons mentioned in the foregoing this number of diodes was two, consequently the number of diodes in the control circuit of driver transistor 61 is raised to three.

Further, in response to the high voltage at tapping point 68, the voltage at tapping point 64 becomes of such a high value that diode 78 becomes reverse-biassed. The current determined by the driver transistor 63 is then supplied by current source 57.

As a result of the high voltage at tapping points 64 through 66, a base current will thereafter flow for transistor 9 from tapping point 66 to the load 55, which renders transistor 9 conductive. A base current for transistor 8 can now flow from tapping point 65 to the load, via the main current path of transistor 9, which renders transistor 8 conductive. A base current for transistor 7 can then flow from tapping point 64 to the load via the main current paths of the transistors 8 and 9, in response to which transistor 8 is rendered conductive. A load current will then flow from supply terminal 3 to the load 55 via the main current paths of the transistors 7, 8 and 9.

It should be noted that then there is a voltage of nearly 100 volts between the emitter of transistor 8 and the further supply terminal 52. Therefore, two diodes 18-1 and 18-2 are arranged between this emitter and the further supply terminal 52 to limit the inverse voltage across each of these two diodes to 50 volts.

This means that two diodes must also be arranged between the supply terminal 75 and the tapping point 65, to which the base of transistor 8 is connected, as the voltage at the base of transistor 8 is equal but for one junction voltage to the emitter voltage, so that an inverse voltage of 50 volts at a maximum is present across each diode 79-1 and 79-2. These two diodes 79-1 and 79-2 are also required to keep the transistor 8 in its non-conductive state at an output voltage of less than −50 volts.

At a further decrease of the input voltage, the voltage of driver transistor 61 will increase and consequently the voltage across the current source 57 will decrease. The current source 57 then functions as a load for the signal amplifying driver transistor 61.

What has been said for the current sources 58 and 59 and the driver transistors 62 and 63 for the output voltage ranges from −50 volts to 0 volt and from −100 volts to −50 volts respectively, applies in a corresponding manner to the current source 57 and the driver transistor 61 in the output voltage range from 0 volt to +50 volts.

It should further be noted that in an identical manner as described for the embodiment in FIG. 1, the relevant current reversal also applies to the amplifier circuit shown in FIG. 2. In the embodiment described in FIG. 2, the voltages across all elements are limited to a maximum of 50 volts apart from current sources 72 and 73, across which the voltage may increase to 150 and 100 volts, respectively, when the transistor 63 has been driven to saturation. The voltage at the supply terminals 72 and 73 can indeed be considerably decreased not by more than 50 volts, so that in all circumstances more than 100 volts will be present across the current source 72.

Figures 3, 4:
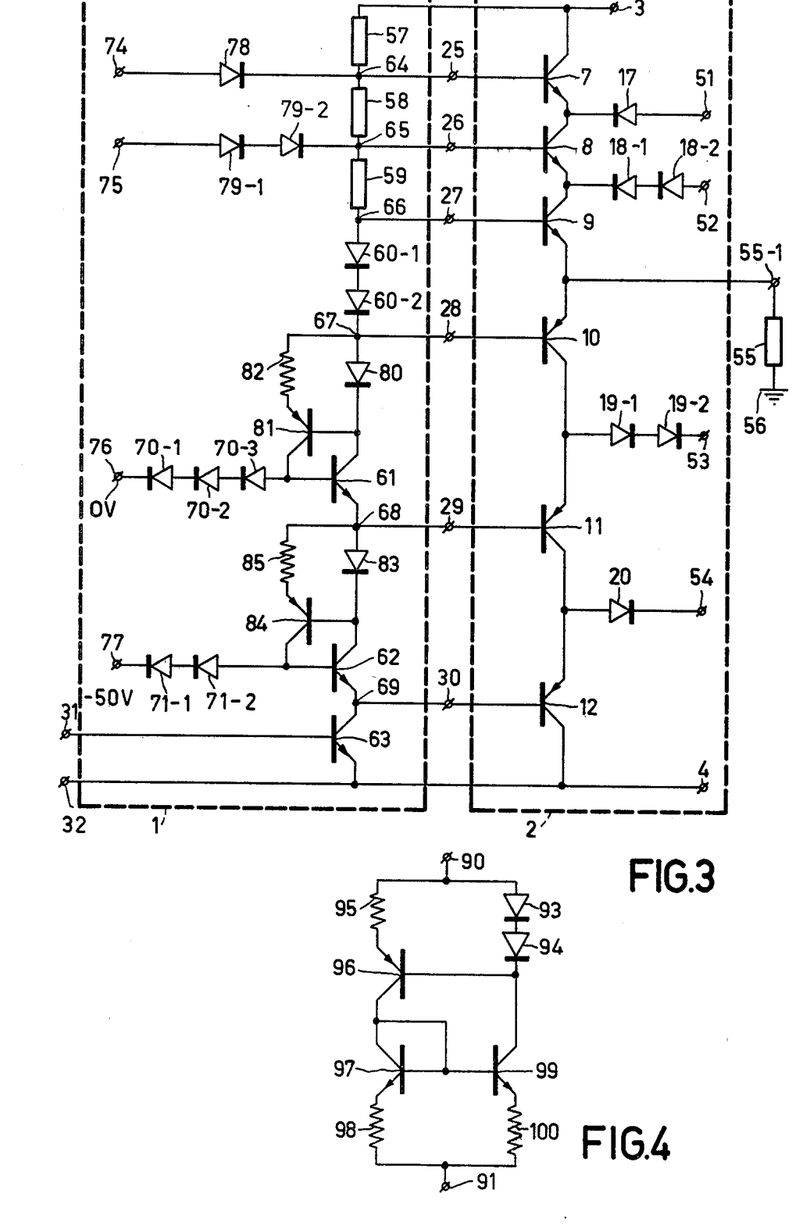
FIG. 3 shows a modification of the embodiment shown in FIG. 2.
FIG. 4 shows an embodiment of an impedance circuit for use in the embodiments shown in FIGS. 2 and/or 3.

The embodiment shown in FIG. 3 does not have this disadvantage.

This embodiment shows an amplifier circuit in which the amplifier stage 2 as well as the control circuit 1 can be wholly implemented by means of the same low-voltage technology.

The amplifier stage 2 shown in this embodiment is identical to the amplifier stage shown in FIG. 2, only the control circuit 1 deviates from the control circuit shown in FIG. 2.

Instead of current sources which are only connected to bases of the driver transistors 61 and 62, the control circuit includes current mirror circuits which are partly arranged in series with these driver transistors. The current source, which is partly arranged in series with the main current path of transistor 61, comprises a diode 80 which is connected between the tapping point 67 and the collector of the driver transistor 61 and whose conductivity direction is the same as that of the driver transistor 61. The diode 80 is shunted by a resistor 82 and the base-emitter junction of an auxiliary transistor 81 of the same conductivity type as the transistors 10 to 12. The collector of transistor 81 is connected to the base of the driver transistor 61.

Likewise, a diode 83 is included between the tapping point 68 and the collector of driver transistor 62, the conductivity direction of this diode corresponding to that of the driver transistor 62. The diode 83 is shunted by a resistor 85 and the base-emitter junction of an auxiliary transistor 84, which is of the same conductivity type as that of auxiliary transistor 81. The collector of transistor 84 is connected to the base of the driver transistor 62. A desired base current for the driver transistors 61 and 62, respectively, is derived from the reference current flowing through the diodes 80 and 83, respectively, resistors 82 and 85, respectively, and the auxiliary transistors 81 and 84, respectively. For input voltages whose value at the tapping points 68 and 69, respectively, is more positive than 0 volt and −50 volts, respectively, the excess of the control current supplied by the auxiliary transistors 81 and 84, respectively, flows to supply terminal 76 and 77, respectively. For input voltages for which the voltage at the tapping points 68 and 69, respectively, is more negative than 0 volt and −50 volts, respectively, driver transistors 61 and 62, respectively, are driven to saturation.

The operation of the amplifier circuit is otherwise identical to the operation explained with reference to the embodiment shown in FIG. 2. It should be noted that the voltage between the tapping points 67 and 68 and the voltage between the tapping points 68 and 69 are limited to a maximum of 50 volts in the manner described in the foregoing, so that a voltage higher than 50 volts cannot be produced across each of the elements 80, 81, 82, 83, 84 and 85. Consequently, the embodiment shown in FIG. 3 can be wholly implemented in the same low voltage technology.

The amplifier circuits shown in the FIGS. 1, 2 and 3 are particularly suitable for use in telephone circuits, particularly in subscriber's lines. A subscriber's line carries a d.c. voltage of 0 volt on one of its wires and a −50 volts d.c. voltage on its other wire, an alternating current signal in the form of, for example, a speech signal being superimposed on these two voltages.

By applying suitable input signals to the input terminals 31 and 32, a d.c. voltage of 0 or −50 volts can be taken off at the output. A value of +50 volts and −100 volts is chosen for the voltages of the supply terminals 3 and 4, respectively, to have a +50 volts voltage sweep available for the wire having a 0 volt d.c. voltage and a −50 volts voltage sweep for the wire having a −50 volts d.c. voltage for applying a ringing signal of a sufficient amplitude to the subscriber's line. The construction with symmetrical supply voltages for use as an audio amplifier has already been described in the foregoing.

A current source which is suitable for use in the embodiment of the FIGS. 2 and 3 to realize each of the impedance circuits 57, 58 and 59 in the series arrangement of control circuit 1 is shown in FIG. 4. This current source, which is known per se comprises a series arrangement of two diodes 93 and 94 connected to a first terminal 90 and a series arrangement of a resistor 95 and the base-emitter junction of a transistor 96 connected across these diodes. A base current flowing through the transistor 96 is then determined by the current through the two diodes 93 and 94, the value of the resistor 95 and the current through the base-emitter junction of transistor 96. The relationship between the current through the diodes 93 and 94 and the current through resistor 95 is non-linear. This base current determines the collector current of this transistor. The series arrangement of a diode 97 and a resistor 98 is connected to the collector of transistor 96. Furthermore, a base-emitter junction of transistor 99 and a resistor 100 are connected across the diode 97 and resistor 98, the collector of transistor 99 being connected to the diode 94.

The base current of transistor 99 is determined by the current through the diode 97 and the ratio between the resistors 98 and 100. The relationship between the currents through the resistors 98 and 99 is substantially linear. The base current determines the collector current of transistor 99.

The current flowing through the collector of transistor 99 flows to terminal 90 via the diodes 93 and 94, and as described hereinbefore the current flowing through the transistor 96 is derived from the current through the diodes 93 and 94. The current flowing through the diode 97 and the resistor 98 is that flowing through transistor 96 and determines the current flowing through the transistor 99. Consequently, the currents flowing through transistors 96 and 99 approache an equilibrium. The gain factor of the transistor 96 of this current source exceeds unity. This results in a loop gain exceeding unity in the loop formed by transistor 96, diode 97 and transistor 99 and the resistors 98 and 100, so that this current source starts automatically when a voltage is applied across the terminals 90 and 91.

When the current produced by this current source cannot be fully drained the transistors 96 and 99 become saturated. As a result the gain factor of these transistors decreases causing the current ratio between the currents through the resistor 95 and the diodes 93 and 94 and the currents through the resistors 98 and 100 to change and the current source to adjust itself to a new equilibrium at a smaller supplied current.

The voltage between the terminals can vary over a wide voltage range as the lower and the upper halves of the current source are interconnected by means of the collectors of the transistors 97 and 99.

Up to a voltage from 50 volts to a voltage which is slightly higher than two junction voltages, the circuit continues to operate as a current source. Thereafter this impedance circuit adjusts itself to a lower current in the above-described manner.

In view of the aforementioned properties this current source is suitable for use as an impedance circuit in the embodiments shown in the FIGS. 2 and 3.

What is claimed is:

1. An amplifier circuit, capable of being realized in integrated form, comprising a control circuit, an amplifier stage connected thereto, two supply terminals coupled to supply sources for applying mutually different potentials to the supply terminals, the amplifier stage comprising 2n transistors, where n is an integer greater than two, each having a main current path and a control electrode, the main current paths being connected in series between the two supply terminals; an output terminal connected to the junction point of the nth and the (n+1)th main current path of the series arrangement of transistors, the n transistors arranged between the first supply terminal of the two supply terminals and the output terminal being of a complementary conduction type to the n transistors arranged between the output terminal and the second supply terminal of the two supply terminals; 2(n−1) further supply terminals each of which is connected via at least one diode to one junction point of consecutive main current paths of the series arrangement of the transistors, the junction points to which the further supply terminals are connected not being connected to the output terminal, these further supply terminals also being connected to further supply sources for applying to the supply terminals supply voltages which are located between the potentials of the two supply sources, the diodes being connected such that the diode connected to a predetermined junction point is reverse-biassed when the potential of that junction point lies between the potential of the further supply terminal connected to that diode and the potential of the supply terminal on the same side of the load connection as the further supply terminal; characterized in that the further supply sources apply an at least substantially similar sequence of incrementally decreasing supply voltages to both the respective (n−1) further supply terminals, considered from that terminal of the two supply terminals which has the highest polarity towards the output terminal, and to the respective (n−1) further supply terminals considered from the output terminal towards the other one of the two supply terminals, wherein the difference between the voltage of one of said further supply sources and the next adjacent further supply source does not exceed the breakdown voltage of any of said transistors under all normal operating conditions, and wherein the control circuit comprises a series circuit connected between first and second control circuit supply terminals, characterized in that said series circuit comprises n serially arranged impedance circuits, a voltage shifting stage, n−1 driver circuit arrangements and a driver transistor having its main current conduction path arranged serially with the last of said n−1 driver circuit arrangements and said second control circuit supply terminal, the junctions between said impedance circuits, said voltage shifting stage, said n−1 driver circuit arrangements and said driver transistor being connected sequentially to the base terminals of said amplifier stage, the junctions between said impedance circuits being connected to the base terminals of said transistors connected between said first supply terminal of said amplifier stage and said output terminal, said further supply terminals being connected to the junctions between said impedance circuits via diodes, and an input terminal connected to the base of said driver transistor, and characterized in that said n−1 driver circuit arrangements each include a first, a second and a third terminal, said third and second terminals being arranged serially in said series circuit, said n−1 driver circuits each comprising a main transistor having a base connected to said first terminal, an emitter connected to said second terminal and a collector connected to said third terminal via a diode, and an auxiliary transistor having a collector connected to said first terminal, a base connected to the collector of said main transistor, and an emitter connected to said third terminal via a resistor, said further supply terminals being connected to said first terminals of said n−1 driver circuit arrangements.

2. An amplifier circuit as claimed in claim 1, characterized in that the number of diodes arranged between each of the further supply terminals of the amplifier stage and the junction points coupled thereto of the main current paths of the transistors is equal to the number of main current paths of the transistors in the series circuit arranged between that further supply terminal and the nearest of the two supply terminals; the number of diodes arranged between the further supply terminals and the tapping points of the series circuit of the control circuit which have been added to the impedance circuits is equal to the number of impedance circuits arranged between each of these further supply terminals and the first supply terminal; and the number of diodes arranged between the further supply terminals and the control inputs of the driver circuit arrangements is equal to one plus the number of main current paths of the driver circuit arrangements and the driver transistor which are arranged between each of the further supply terminals and the second control circuit supply terminal.

3. An amplifier circuit, capable of being realized in integrated form, comprising a control circuit, an amplifier stage connected thereto, two supply terminals coupled to supply sources for applying mutually different potentials to the supply terminals, the amplifier stage comprising 2n transistors, where n is an integer greater than two, each having a main current path and a control electrode, the main current paths being connected in series between the two supply terminals; an output terminal connected to the junction point of the nth and the (n+1)th main current path of the series arrangement of transistors, the n transistors arranged between the first supply terminal of the two supply terminals and the output terminals being of a complementary conduction type to the n transistors arranged between the output terminal and the second supply terminal of the two supply terminals; 2(n−1) further supply terminals each of which is connected via at least one diode to one junction point of consecutive main current paths of the series arrangement of the transistors, the junction points to which the further supply terminals are connected not being connected to the output terminal, these further supply terminals also being connected to further supply sources for applying to the supply terminals supply voltages which are located between the potentials of the two supply sources, the diodes being connected such that the diode connected to a predetermined junction point is reverse-biassed when the potential of that junction point lies between the potential of the further supply terminal connected to that diode and the potential of the supply terminal on the same side of the load connection as the further supply terminal; characterized in that the further supply sources apply an at least substantially similar sequence of incrementally decreasing supply voltages to both the respective (n−1) further supply terminals, considered from that terminal of the two supply terminals which has the highest polarity towards the output terminal, and to the respective (n−1) further supply terminals considered from the output terminal towards the other one of the two supply terminals, wherein the difference between the voltage of one of said further supply sources and the next adjacent further supply source does not exceed the breakdown voltage of any of said additional transistors under all normal operating conditions, and wherein the control circuit comprises a series circuit connected between first and second control circuit supply terminals, characterized in that the series circuit comprises n serially arranged impedance circuits, a voltage shifting stage, and n driver transistors having their main current conduction paths arranged serially, that the junctions of the impedance circuits, voltage shifting stage, and driver transistors are connected sequentially to the base terminals of the amplifier stage, the junctions of the impedance circuits being connected to the base terminals of the transistors connected between the first supply terminal of the amplifier stage and the output terminal, that the further supply terminals are connected sequentially to the junctions between the impedance circuits via diodes, that an input terminal is connected to the base of the driver transistor connected to the second control circuit supply terminal, and that the further supply terminals are connected sequentially to the bases of the other driver transistors.

4. An amplifier circuit as claimed in claim 1, characterized in that the driver transistors are of the same conductivity type as the n transistors located between the first supply terminal of the amplifier stage and the output terminal and that the bases of the other driver transistors are connected sequentially via individual current sources to the first supply terminal of the amplifier stage pg,38 and (n−2) further supply terminals starting with the further supply terminal having a voltage one increment from that of the first supply terminal of the amplifier stage.

5. An amplifier circuit as claimed in claim 4, characterized in that the number of diodes arranged between each of the further supply terminals of the amplifier stage and the junction points coupled thereto of the main current paths of the transistors is equal to the number of main current paths of the transistors in the series circuit arranged between that further supply terminal and the nearest of the two supply terminals and that the number of diodes arranged between the further supply terminals and the tapping points of the series circuit of the control circuit which have been added to the impedance circuits is equal to the number of impedance circuits arranged between each of these further supply terminals and the first supply terminal, and that the number of diodes arranged between the further supply terminals and the control inputs of the driver transistors is equal to one plus the number of main current paths of the driver transistors which are arranged between each of the further supply terminals and the second supply terminal.

6. An amplifier circuit as claimed in claim, 4 or 1 inclusive, characterized in that each impedance circuit is in the form of a current source.

* * * * *